(12) United States Patent  (10) Patent No.: US 7,659,797 B2
Tucker  (45) Date of Patent: Feb. 9, 2010

(54) LOW-LEAKAGE EMC FILTER

(75) Inventor: Andrew C. Tucker, Solothurn (CH)

(73) Assignee: Schaffner EMV AG, Luterbach (CH)

( * ) Notice: Subject to any disclaimer, the term of this patent is extended or adjusted under 35 U.S.C. 154(b) by 0 days.

(21) Appl. No.: 12/349,332

(22) Filed: Jan. 6, 2009

(65) Prior Publication Data

US 2009/0121805 A1  May 14, 2009

Related U.S. Application Data

(63) Continuation of application No. PCT/EP2007/058442, filed on Aug. 15, 2007.

(30) Foreign Application Priority Data

Aug. 15, 2006  (EP) .................................. 06118962

(51) Int. Cl.
*H03H 7/00*  (2006.01)
(52) U.S. Cl. ...................... 333/181; 333/167; 333/175; 333/177
(58) Field of Classification Search ................ 333/167, 333/175, 177, 181; 307/105; 363/39, 44, 363/45, 47; 327/552; 318/771, 772
See application file for complete search history.

(56) References Cited

U.S. PATENT DOCUMENTS 5,999,423 A * 12/1999 Steinke et al. .................. 363/40
6,075,425 A * 6/2000 Gopfrich et al. ............. 333/181
6,775,157 B2 * 8/2004 Honda .......................... 363/39
2007/0139849 A1 * 6/2007 Beil et al. .................... 361/118
2007/0159860 A1 * 7/2007 Haeberle et al. ............... 363/44

FOREIGN PATENT DOCUMENTS

| EP | 0986165 | 1/2000 |
|---|---|---|
| EP | 1619768 | 1/2006 |
| GB | 2326995 A | 1/1999 |
| WO | WO-2006/008322 | 1/2006 |

OTHER PUBLICATIONS

Yo-Chan Son and Seung-Ki Sul, A New Active Common-Mode EMI Filter for PWM Inverter, IEEE Transactions on Power Electronics, Nov. 2003, pp. 1309-1314, vol. 18, No. 6.
Yo-Chan Son and Seung-Ki Sul, Generalization of Active Filters for EMI Reduction and Harmonics Compensation, IEEE, 2003, pp. 1209-1214.

* cited by examiner

*Primary Examiner*—Robert Pascal
*Assistant Examiner*—Kimberly E Glenn
(74) *Attorney, Agent, or Firm*—Blank Rome LLP

(57) ABSTRACT

EMC filter, connectable between a supply network and an electric operated appliance to reduce conduction noise between said supply network and said appliance, comprising one voltage regulator having an output terminal whose potential is kept close to the earth potential, in order to reduce the voltage drop, at mains frequency, across a "Y" capacitor or an active shunt module. In this way the leakage current to earth is sensibly reduced. The device of the invention is especially useful in corner-earthed three-phase lines or in conjunction with RCD devices.

22 Claims, 6 Drawing Sheets

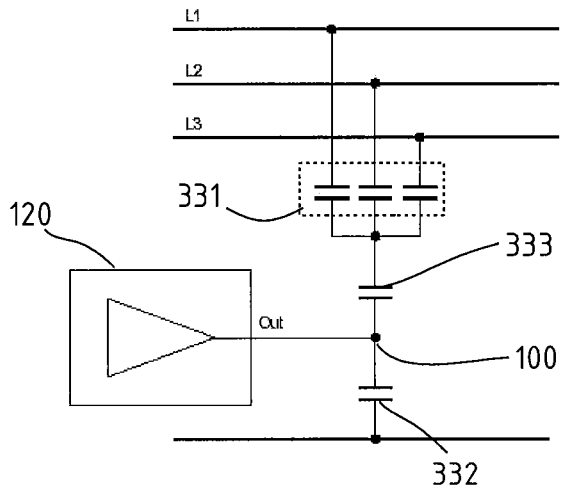
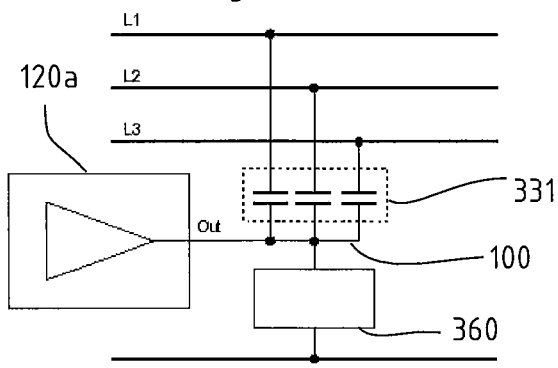
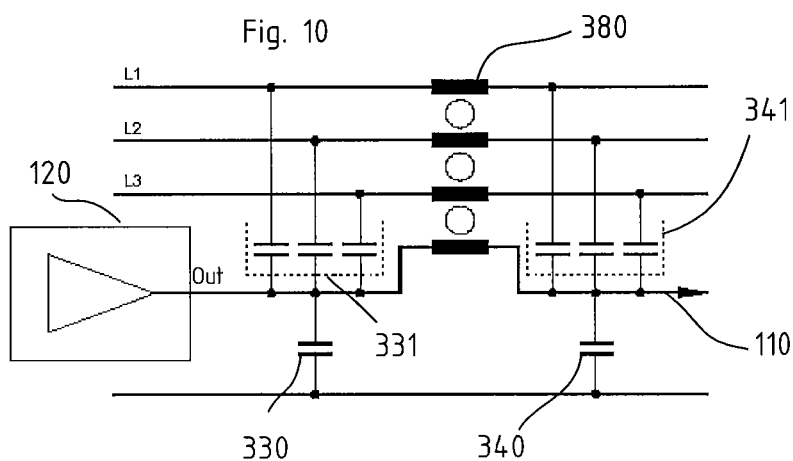
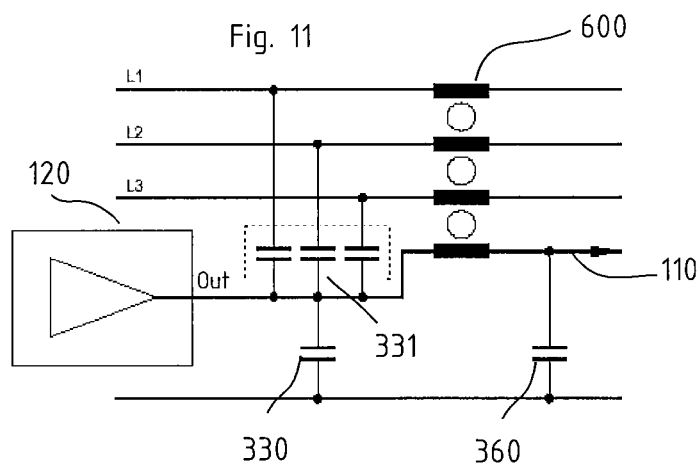

LOW-LEAKAGE EMC FILTER

RELATED APPLICATIONS

The present application is a continuation of international application PCT/EP2007/058442 (WO08020029), filed Aug. 15, 2007, the content of which is hereby incorporated by reference.

FIELD OF THE INVENTION

The present invention pertains to a means for limiting earth leakage current produced by EMC Filters. This invention is particularly useful in power systems where one of the phase conductors is tied to earth, but can be advantageous in most AC and DC power supply systems.

DESCRIPTION OF RELATED ART

Power line EMC filters include in most cases capacitors to earth, so called Y capacitance, together with an appropriate inductance, in order to achieve common mode attenuation. An unavoidable unwanted consequence of this is that a current flows to earth through the Y capacitor—the so called Earth leakage Current (ELC). In FIG. 1, which shows, in single-line diagram form, an example of a known EMC filter, the Y capacitance is indicated by reference number 30, 36 is the corresponding inductance, and 35 is the path of earth leakage current. As a rule, the higher the capacity of the Y capacitor and the voltage across it, the more intense is the ELC.

At high level, this ELC is considered dangerous to personnel. Apart from the personal danger, excessive ELC can interfere with the reliable operation of an electrical system. In particular installations that include Residual Current Detection (RCD) will be interrupted due to tripping of the RCD device. Hence it is considered good design to minimize earth leakage current when designing EMC filters.

For power systems with star grounded supply (i.e. a TN system in Europe) earth leakage can be a problem, although because the system is balanced around earth potential, the ELC is usually moderate, in normal conditions. High ELC values may however arise in high-power filters or where strong common-mode attenuation is needed.

With the Japanese 230V delta power supply, one phase is grounded (so called "corner earth"). In this case there is no cancellation of earth currents. A large ELC will exist unless only small Y capacitors are used.

The use of RCD devices in Japan is prevalent. This poses a limit to the size of the Y capacitor that can be safely used, without risk of tripping the RDC device. There is therefore a need to find a method where large Y capacitors can be used whilst maintaining a low earth leakage current.

A similar problem exists with IT power systems, as employed, among others, in ships and factories. Here the mains power is only loosely referenced to earth via high impedance. This is done so that in the event of one phase short circuiting to earth, the installation will continue to operate with relative safety. However in this shorted mode the power system is in effect "corner earthed". If large Y capacitors are used then a high ELC will exist.

There is therefore an increasing demand for noise suppression filters with low ELC. Traditionally to limit ELC, such filters have been constructed with reduced capacitance in the earth path. However in order to maintain a suitable attenuation, the filter inductance must accordingly be increased to compensate for the reduced capacitance, which can make the filter larger and more expensive. Even increasing the inductance value is not a complete solution however and filters with small Y capacitance are often less effective, for EMC noise reduction, than filters with a higher Y capacitance. In addition, this increased inductance can lead to increased power loss, temperature rise and end-to-end voltage drop, all adverse conditions.

The module described here has the benefit that large Y capacitors can be used in the filter construction without the risk of tripping RCD devices. Hence there is no need to increase the size of the inductor with its associated disadvantages. The module will maintain low ELC at switch-on and can eliminate virtually all earth leakage current, during any fault condition and during normal running conditions. The invention can be equally applied to single and multistage filters for single or multi-wire applications.

BRIEF SUMMARY OF THE INVENTION

According to the invention, these aims are achieved by means of the object of the appended claims.

BRIEF DESCRIPTION OF THE DRAWINGS

The invention will be better understood with the aid of the description of an embodiment given by way of example and illustrated by the figures, in which:

FIGS. 8-11 illustrate alternative connections of the regulator in a series of EMC filters according to the present invention.

DETAILED DESCRIPTION OF POSSIBLE EMBODIMENTS OF THE INVENTION

Figure 1:
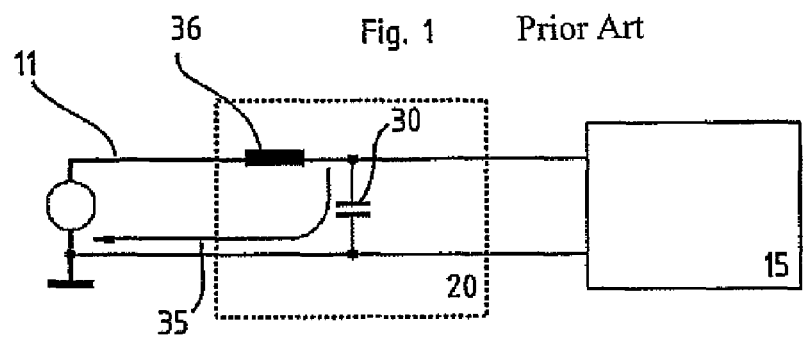
FIG. 1 is a single-line diagram. It shows, in a simplified schematic way, an EMC filter of known type and the path of the leakage current.

The problem and the causes of earth leakage in EMC filter is illustrated in FIG. 1. A power line 11, which can be single or multi-phase, is connected to a device 15 by means of a filter 20, in order to suppress possible interference generated by device 15 and transmitted along the line 11. The filter, in its simplest realization includes the series inductances 36 and a "Y" capacitor 30 connected between phase conductors and the earth conductor. Any potential seen across the "Y" capacitor 30 will contribute largely to the earth leakage current 36.

Figure 2:
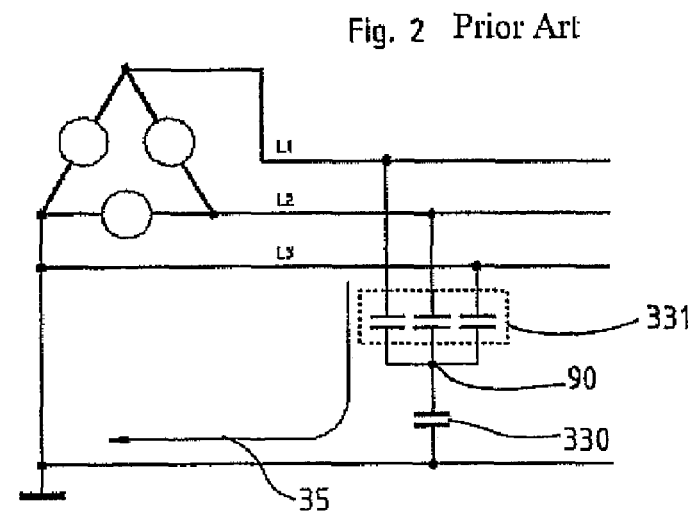
FIG. 2 shows, in a simplified schematic way, a three-phase EMC filter of known type and the path of the leakage current.

The same situation, but in the case of a three-phase power line, is represented in FIG. 2. In this case know filters employ a bank of "X" capacitors 331 connected across phases L1, L2, L3, which contribute to the reduction of differential mode noise. Common-mode noise, on the other hand, is suppressed by the capacitor 330 connected between the star point 90 and the ground. If, as in the represented corner-grounded example, the phase potential are not balanced with respect to the ground potential, the "Y" capacitor 330 sees a large potential and lets flow a substantial earth leakage current 35.

Figure 3:
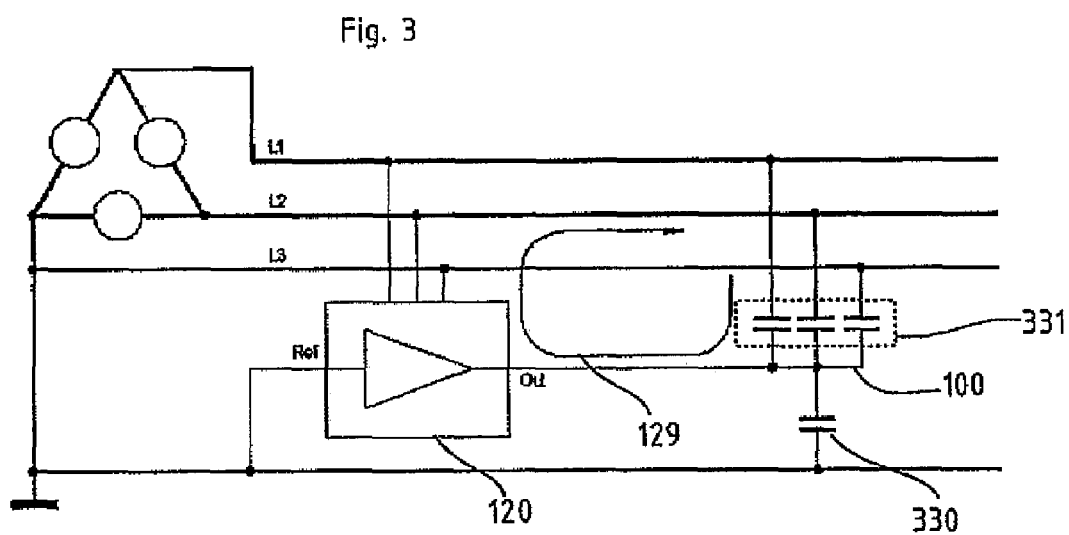
FIG. 3 shows, in a simplified schematic way, a three-phase EMC filter including the leakage suppression features of the present invention inserted in a "corner earth" three-phase system.

FIG. 3 shows, schematically, some features of an Electromagnetic Compatibility filter (EMC filter) according to an aspect of the present invention. This filter, intended for use in a three-phase power line, includes a virtual earth regulator 120 having a reference input (Ref) connected to earth potential or, equivalently, to a conductor essentially at earth potential. The regulator 120 stabilizes the potential of its output (Out) node 100 to a level sensibly constant, forcing it to the earth potential present at the reference (Ref) input. Such regulation and forcing can be obtained by several known devices, all enclosed in the scope of the present invention, some of which will be better discussed in the following by way of example.

A noise shunt module is connected between the output 100 of the voltage regulator 120 and the earth reference potential, for absorbing an eventual noise transmitted on the phase conductors L1, L2, L3. In the represented example the noise shunt module is a simple "Y" capacitor 330, but it is foreseen, in the scope of the present invention, that it may be replaced by a suitable capacitive network, of by a circuit, including passive and/or active elements, presenting a low impedance at the frequencies at which noise is expected.

The effect of the virtual earth regulator 120 is that the "Y" capacitor 330 sees, instead of the full line potential, a much reduced potential which could be limited, according to the precision of the regulation achieved, to some Volts, or even lower. In this way the leakage across the "Y" capacitor 330 is reduced to an insignificant level. Correspondingly, the voltage drop across the "X" capacitors 331 increases as a result of the introduction of the virtual earth regulator 120. The associated leak current 129, however, is drawn by the output of the regulator 120 and returned to the phases L1, L2, L3, via the regulator's supply lines, without contributing to the earth leakage current.

It should be appreciated that it is not essential to the functioning of the invention that the potential virtual ground node 100 should be forced to an absolutely constant value. Indeed it is sufficient that the variation of this potential should be sufficiently reduced in amplitude and/or in speed, in order to limit the earth leakage current through the "Y" capacitor 330 to a harmless quantity. Also, it is not essential that the regulation should be strictly linear or effective at all frequencies.

The virtual ground regulator needs not have a large bandwidth. In practical realizations it is sufficient that the regulator 120 should have low output impedance at low frequency, in order to stabilize the virtual ground potential of node 100 at the mains frequency of 50 or 60 Hz, and up to some low harmonic frequency of the mains frequency, while presenting a high output impedance at high frequency, far from the mains frequency, where the noise is expected. Thus the virtual ground regulator does not necessarily contribute directly to noise suppression, the common-mode noise being shunted to ground via the capacitor 330, as is usual.

To simplify view, FIG. 3 and several subsequent figures do not represent inductive elements of the EMC filter. It is to be understood that these drawing are partial representations given here to describe the invention in its various embodiments, and are not complete. The filter of the invention may also include other elements not represented, like inductors, common-mode inductors, current compensated coils, active elements, connector, fuses and other components; as suggested by circumstances and according to known practices in the art.

Figure 4:
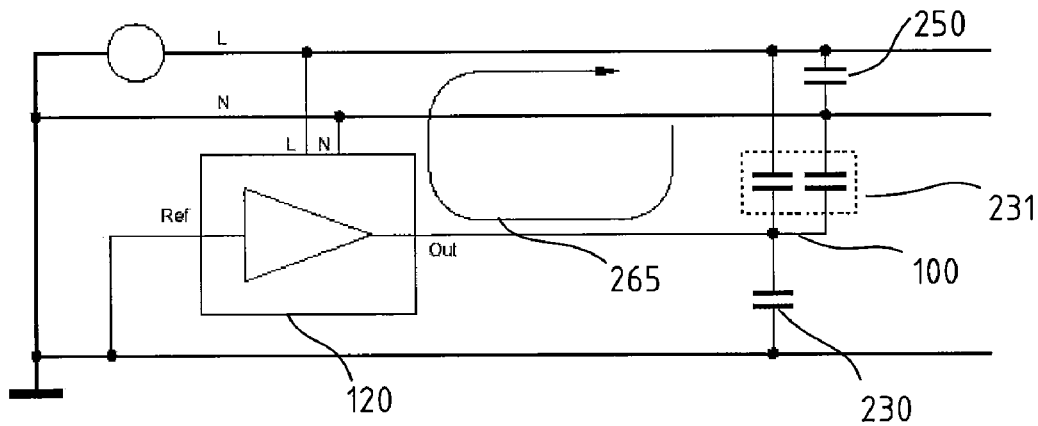
FIG. 4 shows, in a simplified schematic way, an EMC filter including the leakage suppression features of the present invention inserted in a single-phase system.

FIG. 4 shows another example of realization of a filter having a virtual ground node according to the invention. In this case the filter, represented in simplified form without inductive elements, is inserted in a single-phase line having a live (L) and a neutral (N) conductor, as well as an earth conductor and comprises a "Δ" capacitor 250, "X" capacitors 231 and a "Y" capacitor 230. The virtual earth regulator 120 stabilizes the voltage of the virtual earth node 100 to a value close to earth potential. The earth leakage current through the "Y" capacitor 230 is in this way considerably reduced, while the leakage across the V network "X" capacitors 231 is taken up by the regulator 120 and amounts to a negligible electrical load across the live and the neutral conductors, without contributing to earth leakage.

Even if the represented examples describe three-phase and single-phase applications, this is not a limitation of the present invention, which encloses also application to DC and AC power systems having any number of phases and any kind of earthing system.

Figure 5:
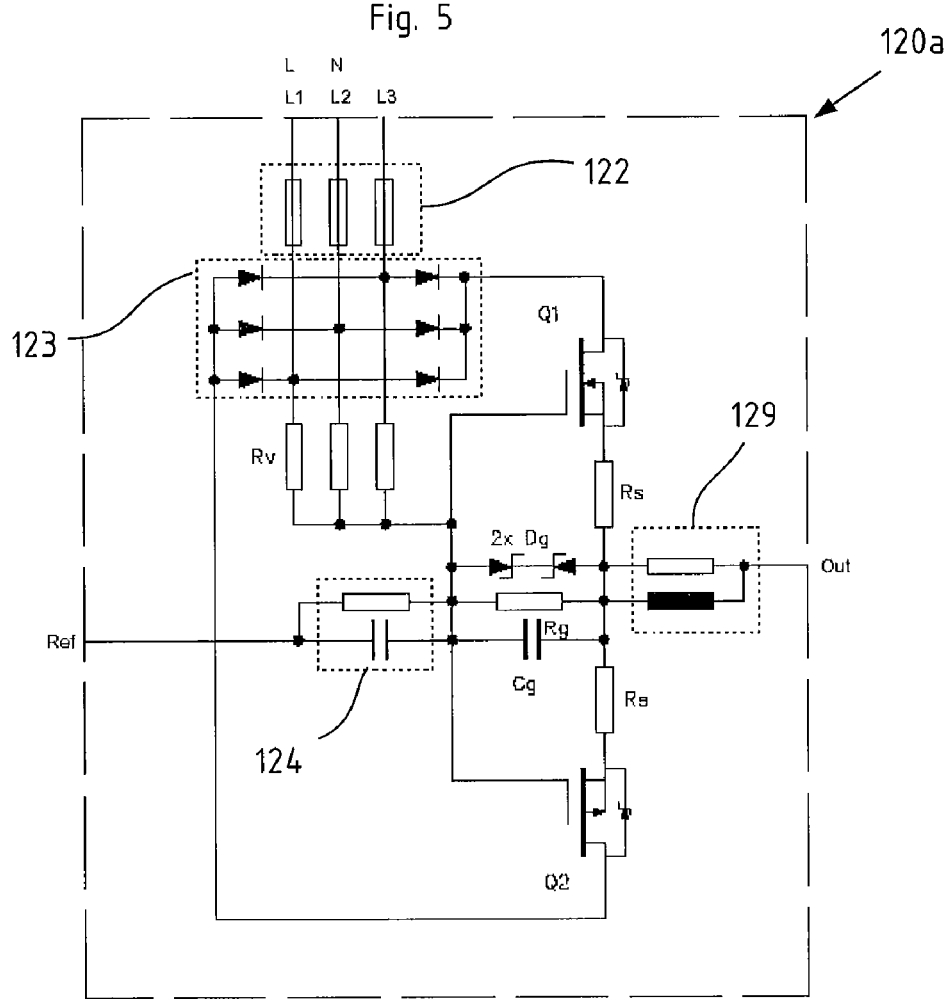
FIG. 5 shows schematically a possible realization of a regulator according to one aspect of the present invention.

FIG. 5 shows one possible circuit realization of a Virtual Earth regulator 120a. This is called a "Coarse Regulator" as the output voltage is only held near to earth potential (typically within +/−10V). Power is fed via fuses 122 to a bridge rectifier 123. The rectified voltage is fed across a complementary pair of FETs (Q1 and Q2). The FET gates are connected together and are referenced to the reference input (Ref), usually at earth potential, via a high impedance RC circuit 124. The regulator output is fed from FET sources via source resistors (2$x$ Rs) and a low impedance 129. Current limiting to protect the FETs is provided by Zener diodes (2$x$ Dg) and source resistors (2$x$ Rs). The output voltage can be controlled from the resistor star network (3$x$ Rv) and from gate impedances (Rg//Cg). The output will be of a square wave when controlled more by Rg and Cb. On the other hand, when the output is controlled more by Rv the action of the regulator 120b is more linear and the output approaches a sine wave.

Note that output impedance 129 also create a high impedance at high frequency and function to block RF noise current from passing through the regulator. This ensures that most RF current passes from power line to earth via the capacitors "X" and "Y".

It should be noted that, since the virtual earth regulator 120a is referenced to ground, its components, and particularly the RC circuit 124, ought to be dimensioned and approved for service at mains voltage. Also the impedance of the RC circuit 124 should be as high as possible, not to contribute to the earth leak current.

Figure 6:
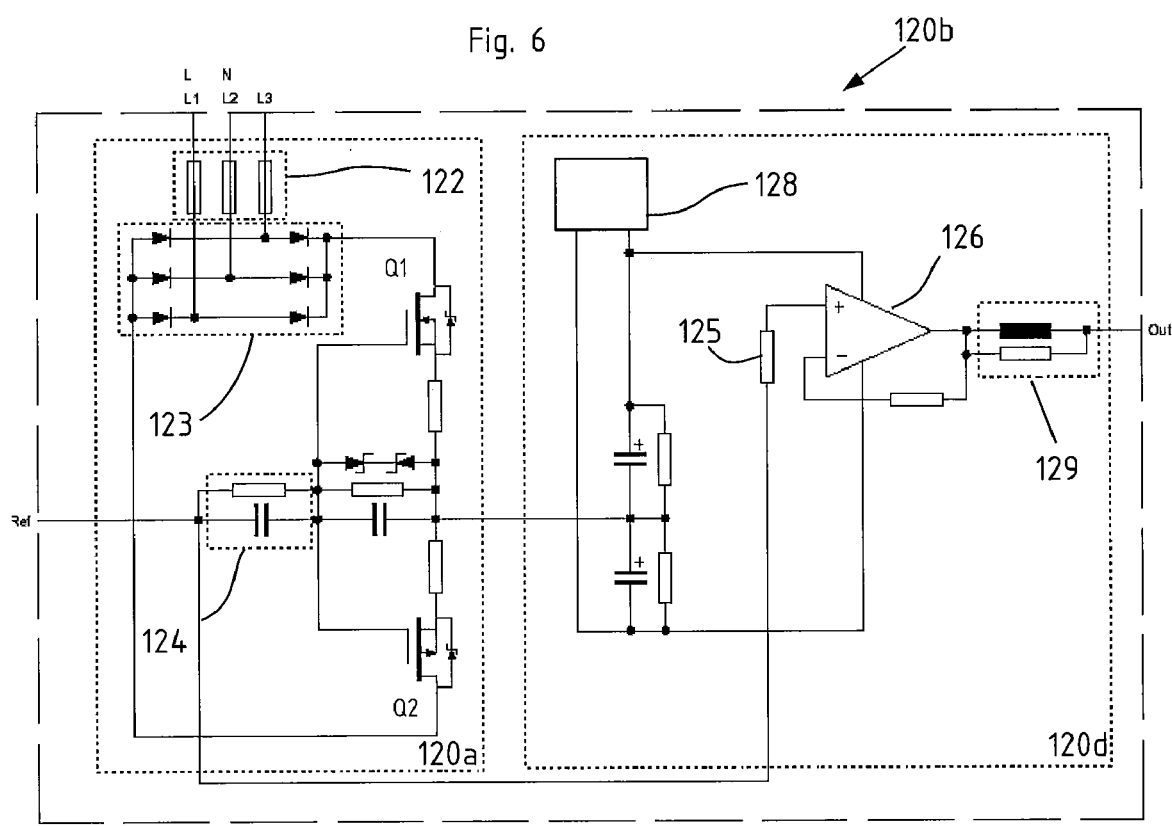
FIGS. 6 and 7 show schematically other variants of realization of the regulator of the present invention.

FIG. 6 shows another possible circuit realization of a Virtual Earth Regulator (VER). This regulator 120b is a series connection of the coarse regulator 120a and a post-regulator 120d. The post-regulator 120d is formed by an operational amplifier 126 fed by an auxiliary power supply 128, which is referenced to the coarse regulator output. The operational amplifier is configured as a voltage follower. Its input is referenced to earth via high impedance 125. The output of the post-regulator is thus held very precisely at earth potential. The coarse regulator 120a avoids the use of a high-voltage operational amplifier, because the operational amplifier 126 is protected from the mains voltage by the coarse regulator

120a. The supply voltage 128 must be large enough to accommodate the dynamic swing of the coarse regulator output (+/−10V). Impedance 125 should preferably be dimensioned and approved for mains voltage, in the eventuality of a failure of the coarse regulator 120a or of the auxiliary supply 128.

In the embodiment of FIG. 5, the voltage at the output of the coarse regulator 120a is not sinusoidal but approximately square, in reason of the dead zone of the FETs Q1, and Q2. The "Y" capacitor 330 (see FIG. 3) has a low impedance for fast-varying signals. Thus, when the coarse regulator of FIG. 5 is used, peaks of leakage current flow through the capacitor 330, in correspondence of the transitions in the output of the coarse regulator 120a, in which the slope dV/dt is high.

The coarse regulator 120a of FIG. 5 is a simpler solution that could provide acceptable results in many cases. In particular, in a power system fitted with RDC devices, these often apply a certain level of integration and are relatively insensitive to short peaks of leakage current. Using the coarse regulator alone may be adequate in such cases.

The post-regulator 120d provides a low-amplitude and low-slope voltage at the output node 100, effectively minimizing leakage across the shunt module 330. The same effect could be achieved replacing the voltage follower realized with the operational amplifier 126 with a circuit made of discrete components, realizing the same function.

Figure 14:
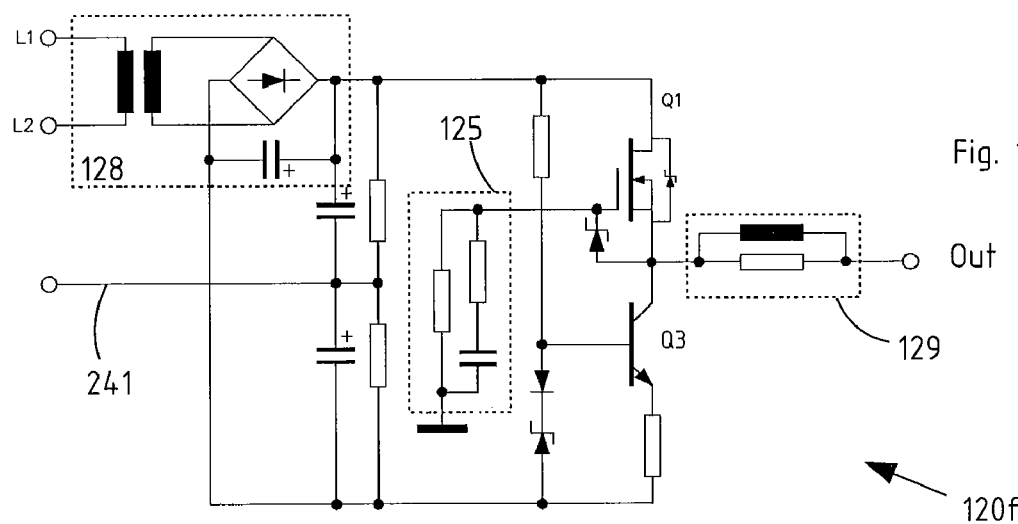
FIG. 14 illustrates a post-regulator circuit using only discrete component, according to an embodiment of the invention.

FIG. 14 illustrates a possible realization of post-regulators 120f, which could replace the block 120d in FIG. 6. Components in common with the circuit of FIG. 6 or of other figures are indicated by the same reference numbers. The regulator 120f uses two transistors Q1 and Q2 and a separate floating power supply 128 connected by means of the terminals L1 and L2 to a suitable source of AC power.

The input of the post regulator is tied close to ground potential by means of the high-impedance network 125 and, at least at mains frequency, the electric potential at the output terminal (Out) will be very low. Hence the leakage of the filter capacitor connected to the output (not represented on this figure) will be very low. The output impedance network 129, on the other hand, blocks RF noise current from passing through the regulator. This ensures that most RF current passes from power line to earth via the capacitors "X" and "Y".

The discrete post-regulator of FIG. 14 is less expensive to realize than the operational amplifier circuit of FIG. 6, and its bandwith can be chosen in order to reduce the risk of parasitic resonances and instabilities.

Figure 7:
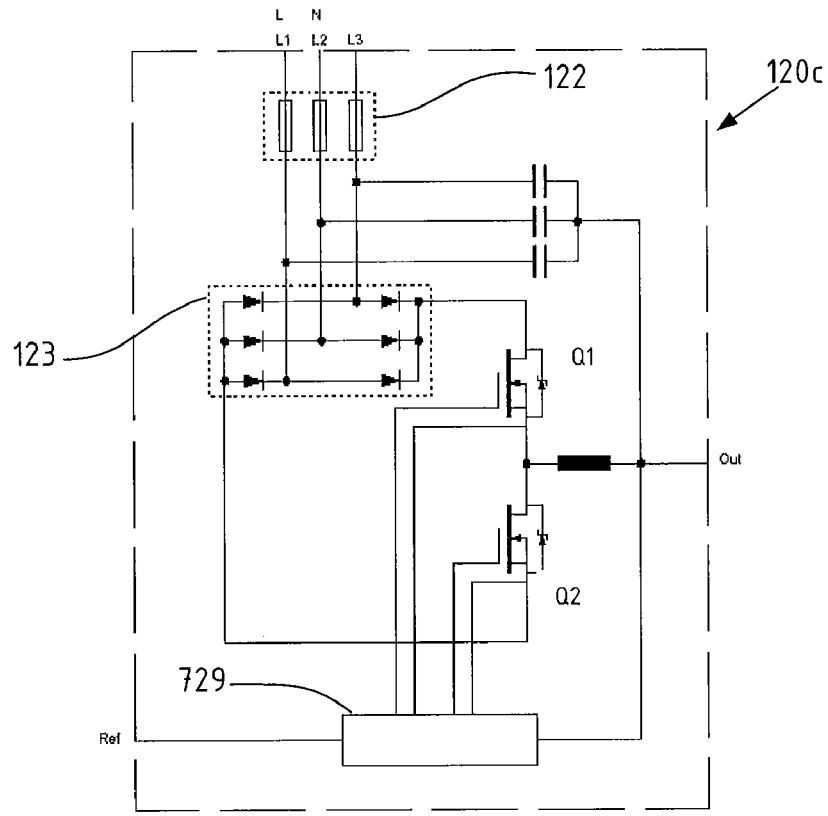

FIG. 7 shows another form of coarse regulator 120c using switching techniques. This circuit shares many components with the coarse regulator 120a of FIG. 5, and these are indicated by the same reference numbers. A notable difference is that transistors Q1 and Q2 are here driven by the digital control circuit 729. This has the advantage of high efficiency.

FIG. 8 shows an alternative connection of the virtual earth regulator 120, in which the virtual earth node is interposed between two "Y" capacitors 333 and 332. This is useful when large "X" capacitors are employed. The virtual earth regulator 120 needs only draw current from the smaller 333 capacitor, thus lower-rated components can be used for the regulator's output stage.

FIG. 9 shows the virtual earth regulator 120 connected to an active shunt module 360, in lieu of a capacitor. The active shunt module 360 is an active impedance that performs the same tasks as the "Y" capacitor 330 of previous examples. Thanks to the superior performance of the active shunt module 360, this circuit is suitable to use with one of the coarse regulators 120a or 120c of FIG. 5 or 7.

FIG. 10 shows the concept of a Virtual Earth Bus 110. One VER module 120 can be used to limit leakage of multiple capacitor networks as used in a multi-stage filter. Optionally the virtual earth bus 110, in passing from one stage to the next, is passed through the common mode inductors 380, with same number and sense of turns as power conductors L1-L3. A second stage of noise attenuation, comprising capacitors 341 and 340 is inserted. Since the "Y" capacitor 340 is connected to the virtual earth bus 110, which is kept close to earth potential by the virtual earth regulator 120, it does not contribute appreciably to earth leaking current. It should be understood that one or both capacitors 330, 340 could be replaced, according to the necessity, by capacitive networks or other shunt means, including active shunt modules.

FIG. 11 shows the Virtual Earth Bus in a multi-stage filter employing the virtual shunt node technique as described in European patent application EP1619768, which is hereby incorporated by reference. Multiple common mode stages are formed while requiring only one VER module 120.

Figure 12:
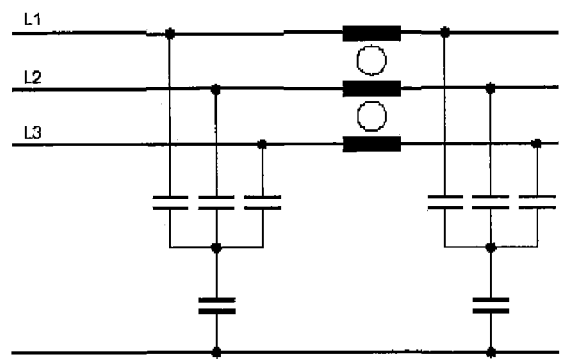
FIG. 12 is a schematic illustration of the principle of virtual shunt nodes introduced in the embodiment of FIG. 11.

The virtual shunt node inductor 600 is realized in a manner to provide, on the virtual earth bus 110, a voltage drop equal or proportional to that present in the power conductors L1, L2, L3 when traversing the inductor 600. In this way the circuit of FIG. 11 is equivalent, for what noise filtering is concerned, to a two-stage filter having two independent banks of "X" capacitors, as illustrated in FIG. 12.

Figure 13:
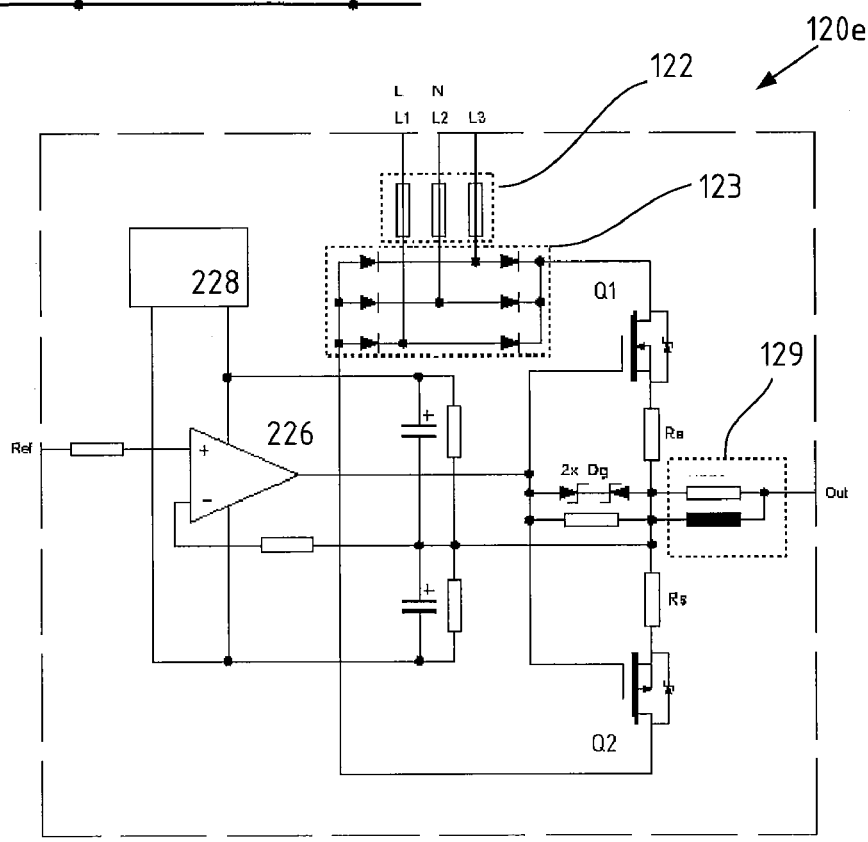
FIG. 13 is a further variant of realization of a voltage regulator according to the invention.

FIG. 13 shows an improved course regulator 120e. Components in common with the coarse regulator 120a of FIG. 5 are indicated by the same reference numbers. With this variant the FET gates are driven form the output of an operational amplifier 226. The operational amplifier is configured as a voltage follower such that the regulator output is maintained very near earth potential. The non-inverting input of the operational amplifier is referenced to earth via high impedance and this is compared with a feed-back voltage from the FET sources. The cross-over dead region of the FETs is, in effect, taken up by the gain of the operational amplifier. In this way the arrangement of FIG. 13 provides an output voltage which is much closer to earth potential than the arrangement of FIG. 5. In an equivalent variant, the operational amplifier 226 could be replaced by an amplifier stage with suitable forward gain, realized with discrete components.

The operational amplifier 226 requires a small auxiliary power supply 228 with voltage greater than FET dead region (approx. +/−5V). The power supply is referenced to the FET source output.

Note that regulator 120b of FIG. 6 provides the most precise virtual earth regulation. The variant 120e of FIG. 13, however, has the advantage of smaller power and dimensioning of the operational amplifier 226 than that required in circuit 120b.

Figure 15:
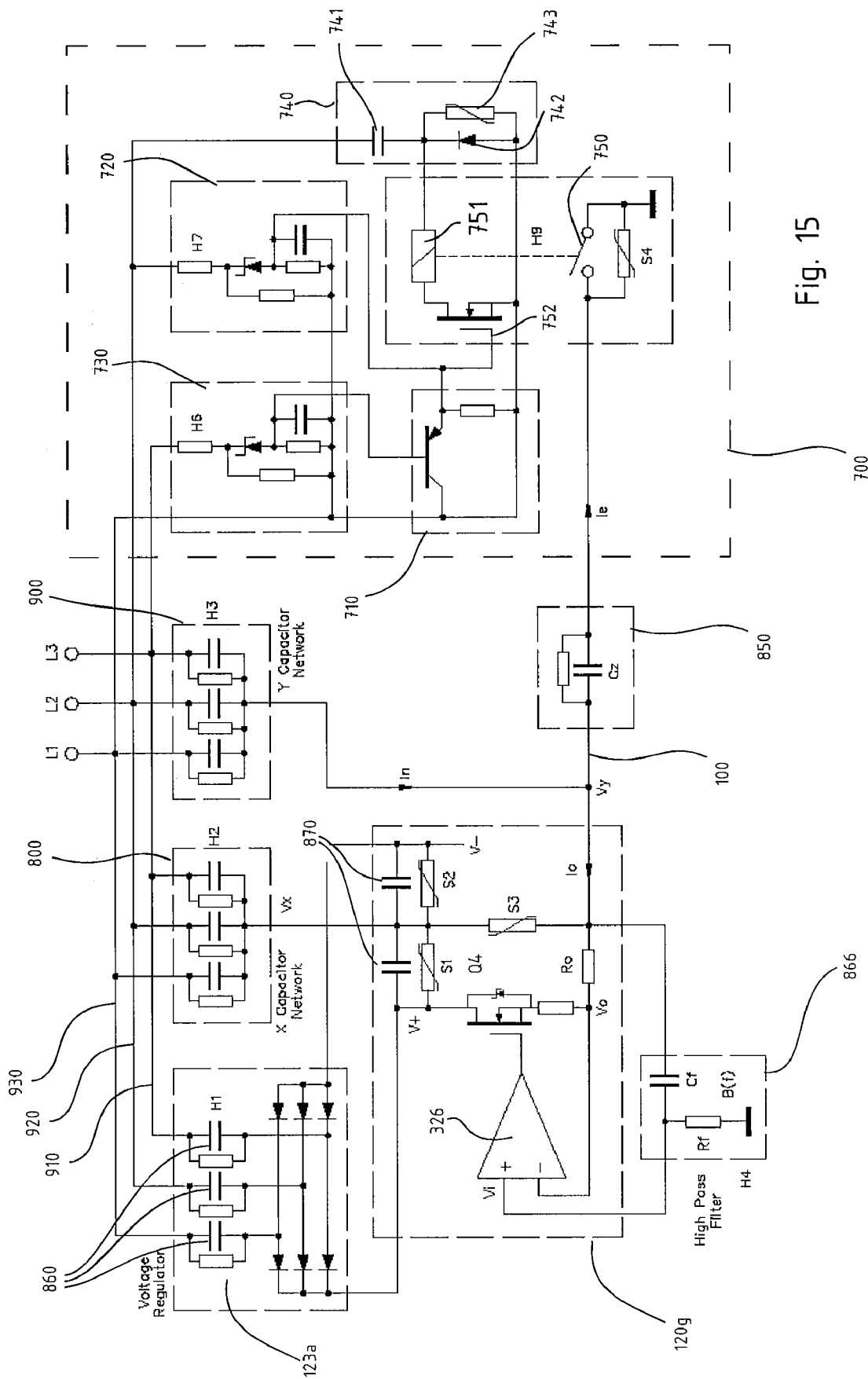
FIG. 15 shows, in a simplified schematic way, another embodiment of the invention including a relay circuit.

FIG. 15 exemplifies another embodiment of the invention, in which a relay circuit 700, comprising two discriminator blocks 720 and 730, a logic AND 710, a voltage regulator 740 and a relay device 750, is added to the EMC filter. The EMC filter also comprises a noise shunt module 850 and a X capacitor network 800 and a Y capacitor network 900 both being connected between the phases 910, 920 and 930 within the EMC filter.

The X capacitor network 800 causes phases that are in an open circuit state (due to a fault) not to become completely dead. Under a double fault condition (2 phases open) both open phases will be energized to the voltage of the remaining phase. Under a single fault (one phase open) the open phase will be energized to half the normal phase to earth voltage. In this latter case, the discriminator blocks 720 and 730 will discriminate between full and half voltage to determine if a fault has occurred. Note that other components within the power supply will also influence the phase voltages during a fault.

The control of relay circuit 700 has no reference to earth, fault detection and relay actuation being entirely between phases and all relay control and actuation circuits are referenced in relation to the phase L1. Note that the use of identifiers L1, L2 and L3 are only for technical description purposes and, in practice, any phase can be connected to any terminal (i.e., this system is not phase sensitive).

Discriminators 720 and 730 monitor the line voltages of phases L2 and L3 respectively relative to phase L1. If the voltage from either phase falls below a threshold voltage then the output flag is set low. The discriminator threshold voltage is set above half the highest peak operating voltage and below the lowest peak operating voltage. The relay block is controlled by the Logic AND output. The Logic AND provides a high output flag only when both discriminator flags are high.

The relay coil 751 is buffered with a field effect transistor 752. Power is provided to the relay coil via the voltage regulator 740. This is advantageous because the relay coil voltage is less than the supply voltage and because the supply voltage will vary. The voltage regulator consists of a surge capacitor 741, rectifier diode 742 and a varistor 743 to limit peak dc voltage. According to a non-represented variant, the relay device 750 may be replaced by any suitable switch device, like for example a solid-state relay, a transistor, and so on. An EMC filter comprising the above relay circuit allows for insulating the noise shunt module in the event of a fault.

At switch-on the voltage across the shunt module 850 can swing anywhere between zero and peak line voltage. Relay 750 is de-energized at this time so its normally-open contacts prevent any flow of current to ground and inrush earth leakage is minimized. Under a single-mode fault or double-mode fault the relay 750 is also de-energized, and shunt module 850 is insulated from earth.

In the circuit of FIG. 15, one side of the shunt module 850 is referenced to ground by means of the relay device 750, the other terminal of the shunt module 850 is connected to the output of virtual earth regulator (VER) 120g. That limits power frequency ELC resulting from power supply imbalance.

In normal operating condition, when the relay device 750 is closed, the Y Capacitor Network 900 is connected to the power lines L1-L3 and the Z capacitor $C_z$ of the shunt module 850 is connected between the Y capacitor network star point 100 and earth. The series combination of these two modules provides the earth path capacitance within the filter.

The output of the VER circuit 120g is connected to the Y star point 100. At power frequencies the Y star point 100 is maintained at near earth potential by the VER module 120g. Thus the Z capacitance sees near earth potential on both electrodes and hence near zero current at power frequencies. This avoids generating the power frequency component of ELC.

Power is provided to the VER module 120g via the voltage supply 123a. This comprises the surge rated capacitors 860. These capacitors are dimensioned to limit power within the power dissipation capability of the Voltage Follower. Maximum power is reached when the load impedance equals the equivalent capacitor impedance. Hence the power supply is self limiting.

The X capacitor network provides differential mode attenuation in the usual way within the filter. It also provides, via capacitors 860 and varistors S1, S2 a stable reference point for the power supply 123a. Due to the large value of the "X" capacitors, the star point presents a very low impedance, and a very low ripple supply voltage can be obtained in this way. In addition the X capacitor network provides a return path for the current drawn from the Y capacitor network, instead of passing current to earth, thus avoiding excessive ELC.

The high pass filter 866 monitors the voltage $V_y$ of Y star point 100 and provides the control voltage $V_i$ at the noninverting input voltage of operational amplifier 326, according to transfer function $V_i/V_y = B(f)$. Circuit analysis of the frequency behavior shows that the VER circuit 120g presents a very low output impedance to star point 100 at low frequency, thus limiting the voltage drop across shunt module 850, and VLC. At higher frequencies, defined by the transfer function B(f) of high-pass filter 866, the output impedance of VER circuit 120g increases, and it can be completely disregarded for the noise, which is shunted to ground by the shunt module 850.

The cutoff frequency of high-pass filter 866 can be placed about 1 kHz, for example. In this way the VER module is effective in limiting the earth leakage current at 50-60 Hz and for the strongest harmonic components of the line voltage, yet the VER module 120g does not have to process any high-frequency noise component. This allows the use of a simple VER module, having high stability and low power consumption. In the presented example, the output stage of the VER module 120g is represented by a single Q4, to simplify the drawing, but would preferably be realized by a complementary pair of transistors as in FIG. 13.

According to an independent aspect of the present invention, the VER module 120g and the power supply unit 123a presented in FIG. 15 could be combined with one of the arrangement of the preceding embodiments, dispensing with the relay protection circuit 700.

The invention claimed is:

1. An EMC filter, connectable between a supply network and an electric operated appliance to reduce conduction noise between said supply network and said appliance, comprising a plurality of capacitors connecting phase conductors of the supply network to a star point, one voltage regulator having an output terminal whose potential is forced to a potential of a reference input of the voltage regulator, and a noise shunt module having one terminal connected to an output of the voltage regulator and to the star point, and another terminal essentially at the same potential as the reference input of the voltage regulator.

2. EMC filter according to claim 1, whereby the voltage regulator acts to reduce a leakage current passing through the noise shunt module.

3. EMC filter according to claim 1, wherein the reference input of the voltage regulator is connectable to an earth conductor of the supply network.

4. EMC filter according to claim 1, wherein the noise shunt module is a capacitor or a capacitive network.

5. EMC filter according to claim 1, wherein the noise shunt module is an active shunt circuit.

6. EMC filter according to claim 1, wherein the voltage regulator is arranged to keep the output terminal to a voltage level within +/−10 Volts, at mains frequency, from the reference input.

7. EMC filter according to claim 1, wherein the voltage regulator comprises a pair of complementary output FETs.

8. EMC filter according to claim 1, wherein the voltage regulator comprises a coarse regulator, arranged to generate a voltage level within +/−10 Volts, at mains frequency, from the reference input, and a post-regulator, with an auxiliary power-supply referenced to the coarse regulator output.

9. EMC filter according to claim 8, wherein the post-regulator comprises an operational amplifier.

10. EMC filter according to claim 7, wherein voltage regulator comprises an amplifier followed the pair of complementary output FETs, in a feedback arrangement.

11. EMC filter according to claim 1, wherein the voltage regulator is essentially linear.

12. EMC filter according to claim 1, wherein the output of the voltage regulator is essentially a square wave.

13. EMC filter according to claim 1, comprising a plurality of shunt modules arranged in stages, wherein the output of the voltage regulator is connected to the plurality of shunt modules.

14. EMC filter according to claim 13, wherein the output (110) of the voltage regulator in traversing from one stage to the next, is passed through a common mode inductors.

15. EMC filter according to claim 14, wherein one of the stages comprises a virtual shunt node.

16. Use of an EMC filter according to claim 1 to reduce an earth leakage current through the noise shunt module.

17. Use of an EMC filter according to claim 16, in a corner-earthed three-phase line or in a single-phase line, or in a IT three-phase line.

18. The EMC filter of claim 1, comprising a relay circuit connected with said noise shunt module, for insulating said noise shunt module in the event of a fault.

19. The EMC filter of claim 18, wherein the relay circuit further includes two discriminators, monitoring a voltage level of two phases of the supply network, relative to a third phase of the supply network.

20. A method for reducing leakage of current to a earth conductor in a EMC filter through a noise shunt module, the filter including a plurality of capacitors connecting phase conductors of a supply network to a star point, the shunt module being connected to the star point on one side, comprising a step of forcing a voltage drop across the noise shunt module with a voltage regulator comprising active elements.

21. The method of claim 20, wherein the noise shunt module comprises a capacitor or a capacitive network or an active circuit.

22. An EMC filter, connectable between a supply network and an electric operated load to reduce conduction noise between said supply network and said load, comprising one noise shunt module having one terminal connected to an output of a voltage regulator, and another terminal essentially at the same potential as a reference input of the voltage regulator.

* * * * *